United States Patent
Lee et al.

(10) Patent No.: US 12,139,581 B2
(45) Date of Patent: Nov. 12, 2024

(54) POLYAMIC ACID COMPOSITION FOR PACKAGING ELECTRONIC COMPONENTS, AND METHOD FOR PACKAGING ELECTRONIC COMPONENTS USING SAME

(71) Applicant: PI ADVANCED MATERIALS CO., LTD., Chungcheongbuk-do (KR)

(72) Inventors: Ik Sang Lee, Gyeongsangbuk-do (KR); Joo Young Kim, Sejong (KR); Gyeong Hyeon Ro, Gyeongsangnam-do (KR)

(73) Assignee: PI Advanced Materials Co., Ltd., Chungcheongbuk-do (KR)

( * ) Notice: Subject to any disclaimer, the term of this patent is extended or adjusted under 35 U.S.C. 154(b) by 682 days.

(21) Appl. No.: 17/294,620

(22) PCT Filed: Oct. 30, 2019

(86) PCT No.: PCT/KR2019/014502
§ 371 (c)(1),
(2) Date: May 17, 2021

(87) PCT Pub. No.: WO2020/105893
PCT Pub. Date: May 28, 2020

(65) Prior Publication Data
US 2022/0010070 A1 Jan. 13, 2022

(30) Foreign Application Priority Data
Nov. 19, 2018 (KR) .......... 10-2018-0142507

(51) Int. Cl.
C08G 73/10 (2006.01)
B81C 1/00 (2006.01)
C08J 5/18 (2006.01)
C09D 179/08 (2006.01)

(52) U.S. Cl.
CPC ...... *C08G 73/1042* (2013.01); *B81C 1/00325* (2013.01); *C08G 73/1032* (2013.01); *C08G 73/1071* (2013.01); *C08J 5/18* (2013.01); *C09D 179/08* (2013.01); *C08G 73/1067* (2013.01); *C08J 2379/08* (2013.01)

(58) Field of Classification Search
CPC .......... C08G 73/1067; H01L 23/293
See application file for complete search history.

(56) References Cited

U.S. PATENT DOCUMENTS

| | | | | |
|---|---|---|---|---|
| 6,139,926 A | * | 10/2000 | Auman | C08G 73/1042 428/473.5 |
| 2007/0260036 A1 | * | 11/2007 | Kaneshiro | C08J 5/18 528/353 |
| 2008/0138637 A1 | * | 6/2008 | Yanagida | C09J 7/20 427/457 |
| 2017/0365490 A1 | * | 12/2017 | Ow | H05B 6/68 |
| 2022/0002489 A1 | * | 1/2022 | Ro | C08G 73/1032 |

FOREIGN PATENT DOCUMENTS

| | | | | |
|---|---|---|---|---|
| EP | 3179504 A1 | | 6/2017 | |
| EP | 3392878 A1 | | 10/2018 | |
| JP | 2006028271 A | | 2/2006 | |
| KR | 2010-0066637 A | * | 6/2000 | |
| KR | 1020130076154 A | | 7/2013 | |
| KR | 1020140114953 A | | 9/2014 | |
| KR | 1020160030889 A | | 3/2016 | |
| KR | 1020160083203 A | | 7/2016 | |
| KR | 2017-0051835 | | 5/2017 | |
| KR | 20170069942 | | 6/2017 | |
| KR | 101988809 B1 | | 6/2019 | |
| WO | WO-2004035698 A2 | * | 4/2004 | ............ A01N 63/00 |

OTHER PUBLICATIONS

Machine translation of KR 2010-0066637 (no date).*
Machine translation of JP 10-298286 (no date).*
Abstract for KR 920008723 (no date).*
1st Office Action of Japanese Application No. 2021-527053 issued on Apr. 25, 2022.

* cited by examiner

*Primary Examiner* — Marc S Zimmer
(74) *Attorney, Agent, or Firm* — Hammer & Associates, P.C.

(57) ABSTRACT

The present invention relates to a polyamic acid composition for packaging electronic components and a method for packaging electronic components using the same, wherein the polyamic acid composition comprises a dianhydride main component having a benzophenone structure as a dianhydride-based monomer in a high proportion and a diamine component having a benzene ring as a diamine-based monomer, whereby it is possible to improve a coefficient of thermal expansion, a glass transition temperature, an elongation, and the like of a polyimide thin film formed therefrom, and when the polyimide thin film is used as a packaging material for an inorganic material such as a silicon water, it exhibits excellent adhesion to the inorganic material and can be easily removed upon $O_2$ plasma removal, as well as has a remarkably low residual ratio of organic residues on the surface of the inorganic material after the removal, so that it can be easily used as a packaging material for electronic components and the like.

14 Claims, 1 Drawing Sheet

[Figure 1]
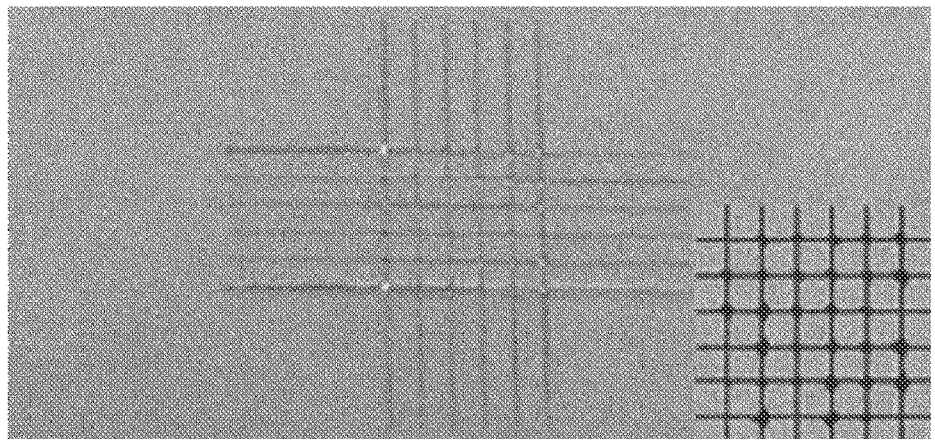
[Figure 2]
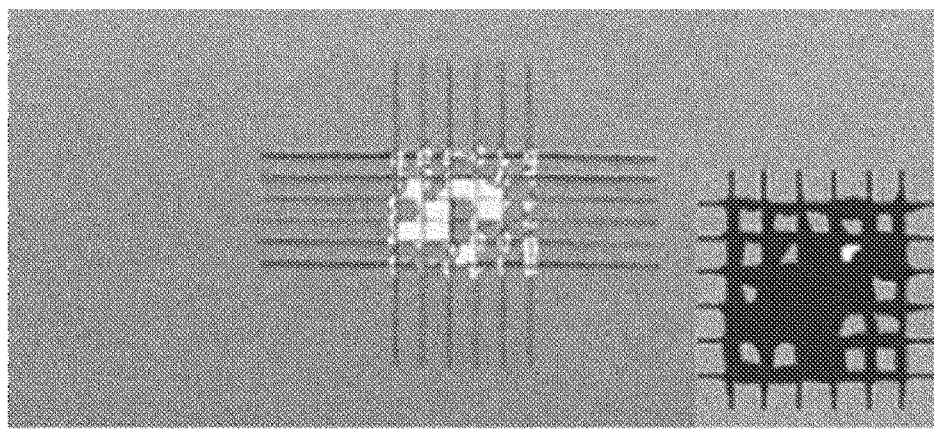

POLYAMIC ACID COMPOSITION FOR PACKAGING ELECTRONIC COMPONENTS, AND METHOD FOR PACKAGING ELECTRONIC COMPONENTS USING SAME

CROSS-REFERENCE TO RELATED APPLICATIONS

This application claims the benefit of priority based on Korean Patent Application No. 10-2018-0142507 filed on Nov. 19, 2018, the disclosure of which is incorporated herein by reference in its entirety,

TECHNICAL FIELD

The present invention relates to a polyamic acid composition for packaging electronic components and a method of packaging electronic components using the same.

BACKGROUND ART

Electronic devices such as a MEMS (micro electro mechanical system) and organic light emitting diodes are complex structures including electronic components such as semiconductors, diode elements and substrates, and for their manufacture, electronic components can be packaged by means of a temporary bonding means referred to as a. 'sacrificial layer.'

In one example, the MEMS may consist of a structure in which microelectronic components, such as sensors, diodes, actuators, microfluidic, and RF-circuits, manufactured on a silicon-based wafer substrate are assembled, and may have a floating part so that a mechanical movement is possible, usually, so that fluctuation is possible on the silicon-based wafer substrate.

Here, to form the floating part or for hulk micromachining capable of integration with IC circuits, the sacrificial layer can be bonded onto the silicon-based wafer substrate, on which electronic elements are formed, during the manufacturing process to package the electronic elements, and then removed.

Processes using metal materials, nitrides, oxides and fluorides, and the like, as materials for the sacrificial layer have been developed, but a physical/chemical deposition method must be applied to these materials to form the sacrificial layer, so that packaging is difficult and all of these materials have a problem that low-temperature processes are difficult Thus, a polyimide-based material that can be simply applied to perform packaging easily and is advantageous in terms of a low-temperature process and a silicon matching process, specifically, a polyamic acid solution that can be applied to a predetermined thickness within a desired packaging range and can be bonded to an inorganic material in the form of a polyimide resin upon curing has emerged as the next generation material for the sacrificial layer.

However, the polyimide-based material belongs to a material having a relatively large coefficient of thermal expansion (CTE) as compared to the inorganic material, which can apply thermal stress to a silicon-based wafer having a relatively small coefficient of thermal expansion as compared thereto in the packaging process or the subsequent processes.

Specifically, the difference in the coefficient of thermal expansion between the polyimide-based material and the silicon-based wafer causes tensile stress on the silicon-based wafer during the heating process of the packaging process and causes compressive stress in the cooling process after packaging, whereby problems such as breakage and destruction of the silicon-based wafer can be caused.

In addition, a plurality of membrane materials may be formed on the sacrificial layer, and thermal stress may be induced in the membrane material due to the large coefficient of thermal expansion of the polyimide-based material, and consequently, the membrane material may also be damaged or destroyed as in the case of a silicon wafer.

Meanwhile, for the removal of the sacrificial layer made of organic materials such as the polyimide resin, a method of oxidizing and decomposing organic materials through an etching method using O2 plasma is commonly used, but while the polyimide resin is not easily decomposed even by the etching using O2 plasma due to the excellent chemical resistance inherent in the polyimide, organic residues derived from the polyimide resin may remain in the electronic component after the removal of the sacrificial layer. These organic residues act as foreign substances of inorganic electronic components, so that their quality can be greatly degraded.

Therefore, there is a need for a novel polyimide-based material that can more stably package the inorganic material and minimize the formation of organic residues acting as foreign substances when removed as a sacrificial layer.

DISCLOSURE

Technical Problem

It is an object of the present invention to provide a polyimide-based material capable of stably packaging an inorganic material and Minimizing formation of organic residues acting as foreign substances on the surface of the inorganic material when removed after being used as a packaging material, that is, a sacrificial layer, and a packaging method using the same.

Technical Solution

Therefore, in order to solve the above problem, in one example, the present invention provides a polyamic acid composition, comprising a polyamic acid prepared by polymerizing a dianhydride-based monomer and a diamine-based monomer, wherein the dianhydride-based monomer comprises 60 mol % or more of a dianhydride main component having a benzophenone structure, provided that when the content of the dianhydride having a benzophenone structure is less than 100 mol %, it further comprises a dianhydride subcomponent having one benzene ring.

in one example, the present invention also provides a packaging method, comprising steps of: applying the polyamic acid composition on an inorganic electronic component; and heat-treating the applied polyamic acid composition at 20"C to 400° C., wherein in the polyamic acid composition, the amic acid groups of the polyamic acid are closed and dehydrated through a heat treatment process to generate polyimide, and when the heat treatment is completed, the polyimide resin is cured and bonded on the inorganic electronic component.

Advantageous Effects

The polyamic acid composition according to the present invention comprises a dianhydride main component having a benzophenone structure as a dianhydride-based monomer in a high proportion and a diamine component having a benzene ring as a diamine-based monomer, whereby it is possible to improve a coefficient of thermal expansion, a glass transition temperature, an elongation, and the like of a polyimide thin film formed therefrom.

In addition, when the polyimide thin film is used as a packaging material for an inorganic material such as a silicon wafer, it exhibits excellent adhesion to the inorganic material and can be easily removed upon $O_2$ plasma removal, as well as has a remarkably low residual ratio of organic residues on the surface of the inorganic material after the removal, so that it can be easily used as a packaging material for electronic components and the like.

DESCRIPTION OF DRAWINGS

FIG. 1 is a photograph that the polyimide resin of Example 1 is tested for adhesion and then the surface of the resin is photographed.

FIG. 2 is a photograph that the polyimide resin of Comparative Example 2 is tested for adhesion and then the surface of the resin is photographed.

BEST MODE

In the present invention, various modifications may be made and various examples may be provided, and specific examples will be illustrated in the drawings and described in detail in the detailed description.

However, this is not intended to limit the present invention to specific embodiments, and should be understood to include all changes, equivalents, and substitutes included in the spirit and scope of the present invention.

In the present invention, the term such as "comprise" or "have" is intended to designate the presence of features, numbers, steps, actions, components, parts or combinations thereof described in the specification, but it should be understood that the presence or addition possibility of one or more other features, or numbers, steps, actions, components, parts or combinations thereof is not excluded in advance.

In this specification, the "dianhydride" is intended to include its precursors or derivatives, which may not be technically the dianhydride, but nevertheless, they will react with diamines to form polyamic acids, and these polyamic acids can be converted back to polyimides.

In this specification, the "diamine" is intended to include its precursors or derivatives, which may not be technically the diamine, but nevertheless, they will react with dianhydrides to form polyamic acids, and these polyamic acids can be converted back to polyimides.

When amounts, concentrations, or other values or parameters herein are given as enumeration of ranges, preferred ranges, or preferred upper limits and preferred lower limits, it should be understood to specifically disclose all ranges capable of being formed of any pair of any upper range limit or preferred value, and any lower range limit or preferred value, regardless of whether ranges are disclosed separately. When a range of numerical values is referred to herein, the range is intended to include the end-point value and all integers and fractions within the range, unless otherwise stated, for example, unless there is a limiting term such as more than or less than. It is intended that the scope of the invention is not limited to the specific values mentioned when defining the range.

Hereinafter, the present invention will be described in more detail.

Polyamic Acid Composition

In one example, the present invention provides a polyamic acid composition,
comprising a polyamic acid prepared by polymerizing a dianhydride-based monomer and a diamine-based monomer,
wherein the dianhydride-based monomer comprises 60 mol % or more of a dianhydride main component having a benzophenone structure, provided that
when the content of the dianhydride having a benzophenone structure is less than 100 mol %, it further comprises a dianhydride subcomponent having one benzene ring.

The polyamic acid composition according to the present invention comprises a polyamic acid prepared by polymerizing a dianhydride-based monomer and a diamine-based monomer, wherein the dianhydride-based monomer may comprise a dianhydride main component having a benzophenone structure in a significant proportion.

The polyamic acid composition of the present invention comprises a dianhydride main component having a benzophenone structure, whereby the benzophenone structure may be contained in the polymer chain of the polyamic acid and the benzophenone structure may also be contained in a polyimide polymer chain modified by the polyamic acid polymer chain. The benzophenone structure present in the polyimide polymer chain contains a carbonyl group (C=O) connecting a pair of benzene, where the carbonyl group (C=O) can be very easily oxidized and decomposed by $O_2$ plasma. The polyimide having such a benzophenone structure may cause (i) an increase in generation frequency of low molecular weight organic substances, and (ii) a decrease in generation frequency of low molecular weight polymers accordingly upon $O_2$ plasma treatment. In addition, (iii) even if the crosslinked low molecular weight polymers are present inevitably, the polymers can be easily oxidized and decomposed due to the benzophenone structure present in these polymers, thereby leading to a virtuous cycle of generating more low molecular weight organic substances, so that the residual rate of organic residues can be significantly lowered after the $O_2$ plasma treatment.

As one example, when the polyamic acid composition of the present invention is applied on an inorganic material to form a polyimide thin film and then the thin film is removed, the concentration of the organic residues remaining on the surface of the inorganic material is low, whereby the concentration of the organic residues remaining in the following test (a) surface may be 1,000 ppm or less, and may be, specifically, 10 ppm to 900 ppm, 10 ppm to 800 ppm, 100 ppm to 500 ppm, or 400 ppm to 750 ppm:

Test method (a): A polyamic acid composition is applied on a silicon-based wafer having a width of 1 cm*a length of 1 cm and heat-treated to form a polyimide thin film having a thickness of 12 μm to 15 μm, the formed polyimide thin film is treated with $O_2$ plasma at 75 Watt and 150 mT for 1 minute, and then the concentration of the organic residues derived from the polyimide thin film present on the silicon-based wafer is measured, where the concentration of the organic residues means the weight of the organic residues after treatment with $O_2$ plasma relative to the total weight of the polyimide thin film before treatment with $O_2$ plasma.

The polyamic acid composition according to the present invention indwells a significantly lower concentration of organic residues as above, as compared with usual polyimide-based materials, whereby it can prevent side reactions of the process and insulation deterioration of inorganic materials due to the high concentration of organic residues, and the like.

In addition, the dianhydride main component has a benzophenone structure to induce interaction with a hydrophilic group present on the surface of an object to be bonded, for example, an inorganic material such as a silicon-based wafer, whereby it can improve adhesion between the polyimide resin and the inorganic material.

In general, polyimide-based materials are difficult to be regarded as having high adhesion among polymer materials. There may be various causes of this, but it can be regarded as a major cause that when a polyamic acid composition is film-formed on an object to be bonded, for example, a silicon-based substrate, a weak boundary layer (WBL) is formed at the contact interface with the object to be bonded. For reference, the weak boundary layer is in various forms, but one of them may be a form in which at least a portion of the polyimide resin cured at the contact interface is lifted without supporting the object to be bonded. Such a lifted form may be caused, for example, by weak attractive force acting at the interface between the polyimide resin and the object to be bonded, or by moisture and/or an organic solvent, and the like that volatilize when a polyamic acid composition is converted to a polyimide resin.

However, the polyamic acid composition according to the present invention comprises a dianhydride main component having a benzophenone structure in a significant proportion, whereby it may be advantageous that the volatilization of moisture and/or organic solvent is easily achieved at the initial point of conversion from the polyamic acid composition to the polyimide resin, and it is possible to suppress a phenomenon that the polyimide resin thus formed is lifted from the object to be bonded.

As one example, when evaluating cross-cut adhesion according to ASTM D3359 for a polyimide resin obtained by curing the polyamic acid composition, the area removed by peeling the polyimide resin from the inorganic material may be less than 16% of the total area, specifically, 15% or less, 10% or less, or 5% or less, and in some cases, the removed area may be 0% of the total area because peeling of the polyimide resin does not occur.

At this time, the content of the dianhydride main component contained in the polyamic acid composition may be 60 mol % or more, specifically, 60 mol % to 100 mol %, 65 mol % to 90 mol %, 65 mol % to 80 mol %, or 75 mol % to 90 mol %, and in some cases, the dianhydride min component may be included in 100 mol % to constitute the entire dianhydride-based monomer. By adjusting the content of the dianhydride main component within the above range, the present invention may significantly lower the concentration of organic residues on the surface after removing the polyimide thin film.

In addition, the dianhydride main component may use a dianhydride having a benzophenone structure, and comprise, for example, 3,3',4,4'-benzophenonetetracarboxylic dianhydride (BTDA), and the like. The 3,3', 4,4'-benzophenonetetracarboxylic dianhydride (BTDA) has a benzophenone structure, whereby the concentration of organic residues after $O_2$ plasma treatment is low, as well as it has a flexible molecular structure, whereby it may advantageously function for the polyimide resin prepared from the polyamic acid composition to indwell an elongation of 9% or more, specifically, an elongation of 9% to 15% or 9% to 13.5%.

Furthermore, the polyamic acid composition of the present invention may further comprise a dianhydride subcomponent having one benzene ring when the content of the dianhydride main component is less than 100 mol %

For example, the dianhydride-based monomer may comprise a dianhydride main component having a benzophenone structure in an amount of 60 mol % or more and less than 100 mol %, and may comprise a dianhydride subcomponent in an amount of more than 0 mol % and 40 mol % or less.

The benzophenone structure contained in the dianhydride main component of the present invention may be a relatively flexible monomer in terms of molecular structure because a pair of benzene rings may be bent based on the carbonyl group, where the flexible monomer may increase the coefficient of thermal expansion of the polyimide resin derived from the polyamic acid composition. In this case, the coefficient of thermal expansion of inorganic materials such as silicon is mostly 9 ppm/° C. or less which belongs to the lower side, so that it may not be desirable for the polyimide resin bonded to the inorganic material to have a high coefficient of thermal expansion.

However, the polyamic acid composition of the present invention may comprise a dianhydride subcomponent having one benzene ring to lower the coefficient of thermal expansion of the polyimide resin formed from the composition. The dianhydride subcomponent has one benzene ring between two anhydride groups, and the polymer derived therefrom has a rigid molecular structure in which the main chain is difficult to bend, where it forms a rigid structure that is not flexible in terms of the molecular structure of the polymer, so that the coefficient of thermal expansion may be reduced.

To this end, the dianhydride subcomponent may be used without limitation as long as it has a structure in which one benzene ring exists between two anhydride groups. For example, the dianhydride subcomponent may be pyromellitic dianhydride (PMDA), and the polyimide resin prepared from the polyamic acid composition that the pyromellitic dianhydride is combined with a dianhydride component having a benzophenone structure which is a dianhydride main component may have a coefficient of thermal expansion at an appropriate level, in detail, a coefficient of thermal expansion of 9 ppm/° C. or less, specifically 1 ppm/° C. to 9 ppm/° C., 5 ppm/° C. to 9 ppm/° C., or 7 ppm/° C. to 9 ppm/° C., which is at a level with a small variation in coefficient of thermal expansion for inorganic materials.

In addition, the polyamic acid composition of the present invention comprises a diamine-based monomer, where the diamine-based monomer may comprise a diamine component having one benzene ring in a content of more than 50 mol % relative to the total number of moles, specifically, in a content of more than 60 mol % or more than 70 mol %, and in some cases, it may be included in 100 mol % to constitute the entire diamine-based monomer.

The diamine component comprises one benzene ring between two amine groups in the same manner as the dianhydride subcomponent, so that the polymer derived therefrom may have a rigid molecular structure in which the main chain is difficult to bend, and the dianhydride subcomponent exhibits a synergistic effect with the diamine component having one benzene ring, whereby the polyimide resin prepared from the polyamic acid composition may realize an excellent glass transition temperature. As one example, the glass transition temperature of the polyimide resin may be 420° C. or higher, and specifically, may be 430° C. or higher, or 440° C. or higher, 420° C. to 450° C., or 425° C. to 445° C.

In addition, it may be beneficially acted so that the tensile strength, which is a mechanical property inevitably required for the polyimide resin, is expressed as 300 MPa or more, specifically, 310 MPa or more, 300 MPa, to 350 MPa, 305 MPa, to 345 MPa, 310 MPa to 335 MPa, 320 MPa to 350 MPa, or 330 MPa to 345 MPa.

Such a diamine component may comprise one or more selected from 1,4-diaminobenzene (PPD), 1,3-diaminobenzene (MPD), 2,4-diaminotoluene, 2,6-diaminotoluene and 3,5-diaminobenzoic acid, and among them, 1,4-diaminobenzene, which is advantageous for improving the tensile strength and is capable of acting advantageously to induce the coefficient of thermal expansion to a desired level in combination with the pyromellitic dianhydride, may be preferable as the diamine component having one benzene ring.

Furthermore, the polyamic acid composition of the present invention may further comprise an additive containing at least one selected from acetic anhydride (AA), propionic acid anhydride, and lactic acid anhydride, quinoline, isoquinoline, β-picoline (BP) and pyridine. When the polyamic acid composition is formed into a film and then converted into a polyimide resin, such an additive may help to obtain a desired polyimide resin by promoting a ring closure reaction through dehydrating action on the polyamic acid.

In addition, the additive may be included in an amount of 0.01 moles to 10 moles per 1 mole of the amic acid group in the polyamic acid, and specifically, may be included in an amount of 0.05 moles to 1 mole, 0.05 moles to 0.5 moles, or 0.05 moles to 0.1 moles per 1 mole of the amic acid group.

By controlling the content of the additive within the above range, the present invention can sufficiently promote the ring closure reaction at an appropriate rate through dehydrating action on the polyamic acid, prevent crack occurrence or strength reduction of the converted polyimide due to a small amount of additive and prevent the difficulty of formation in the form of a thin film or the converted polyimide from being broken due to an excessive amount of additive.

Furthermore, the polyamic acid composition of the present invention may further comprise a filler for the purpose of improving various properties such as sliding properties, thermal conductivity and loop hardness of the polyimide resin.

For example, the filler may include silica titanium oxide, alumina, silicon nitride, boron nitride, calcium hydrogen phosphate, calcium phosphate, mica, and the like.

In addition, the average particle diameter of the filler may be determined according to the characteristics of the polyimide resin to be modified and the type of filler to be added. In one example, the average particle diameter of the filler may be 0.05 μm to 100 μm, and specifically, may be 0.1 μm to 75 μm, 0.1 μm to 50 μm, or 0.1 μm to 25 μm.

Furthermore, the additive amount of the filler may be 0.01 parts by weight to 100 parts by weight relative to 100 parts by weight of the polyamic acid composition, and specifically may be 0.01 parts by weight to 90 parts by weight, or 0.02 parts by weight to 80 parts by weight.

By adjusting the average particle diameter and additive amount of the filler to the above range, the present invention can sufficiently realize the effect of modifying the polyimide due to the filler, as well as prevent damage to the surface property of the polyimide or deterioration of mechanical properties due to the filler.

In addition, the polyamic acid composition of the present invention may further comprise an organic solvent in which the polyamic acid composition may be dissolved, where the organic solvent may be an aprotic polar solvent.

Such an aprotic polar solvent may include an amide-based solvent such as N,N'-dimethylformamide (DMF) and N,N'-dimethylacetamide (DMAc), and a phenolic solvent such as p-chlorophenol and o-chlorophenol, N-methyl-pyrrolidone (NMP), gamma-butyrolactone (GBL) and Diglyme, and the like, and these may be used alone or in combination of two or more.

In some cases, an auxiliary solvent such as toluene, tetrahydrofuran, acetone, methyl ethyl ketone, methanol, ethanol and water may also be used to adjust the solubility of the polyamic acid.

As one example, the polyamic acid composition of the present invention may comprise N-methyl-pyrrolidone, N,N'-dimethylformamide and N,N'-dimethylacetamide as organic solvents.

Furthermore, in the polyamic acid composition comprising such an organic solvent, the viscosity of the polyamic acid as measured at 23° C. may be 2,000 cP to 5,000 cP, and specifically, may be 2,500 cP to 4,000 cP 2,500 cP to 3,500 cP or 3,000 cP to 3,500 cP. The viscosity may be a viscosity measured with a Brookfield viscometer on the RV-7 spindle under conditions of a temperature of 23° C. and a rotation speed of 0.5 rpm. In the present invention, the polyamic acid composition may have a solid content in a range of 5 to 30%, 10 to 25%, or 12 to 20%.

By controlling the viscosity of the polyamic acid composition in the above range, the present invention can prevent the dispenser nozzle from being blocked by the polyamic acid composition upon the application process, can easily adjust the shape and thickness of the composition to be applied by appropriately controlling the fluidity of the polyamic acid composition, as well as can prevent the adhesion of the polyimide resin from deteriorating due to the low viscosity.

Meanwhile, in general, the polyamic acid composition can be prepared by the following methods:

(1) a method of putting the entire amount of a diamine-based monomer in an organic solvent, and then adding a dianhydride-based monomer thereto so as to be substantially equimolar with the diamine-based monomer, thereby polymerizing the monomers;

(2) a method of putting the entire amount of a dianhydride-based monomer in an organic solvent, and then adding a diamine-based monomer thereto so as to be substantially equimolar with the dianhydride-based monomer, thereby polymerizing the monomers;

(3) a method of putting some components of a diamine-based monomer in an organic solvent, followed by mixing some components of a dianhydride-based monomer therewith in a ratio of about 95 mol % to 105 mol % relative to the reaction components, and then adding the remaining diamine-based monomer components thereto and successively adding the remaining dianhydride-based monomer components thereto to polymerize the diamine-based monomer and the dianhydride-based monomer so that they are substantially equimolar to each other;

(4) a method of putting a dianhydride-based monomer in an organic solvent, followed by mixing some components of a diamine compound therewith in a ratio of 95 mol % to 105 mol relative to the reaction components, and then adding other dianhydride-based monomer components thereto and successively adding the remaining diamine-based monomer components thereto to polymerize the diamine-based monomer and the dianhydride-based monomer so that they are substantially equimolar to each other; and (5) a method of reacting some diamine-based monomer components and some dianhydride-based monomer components so that any one is in an excessive amount in an organic solvent to form a first polymer, reacting some diamine-based monomer components and some dianhydride-based monomer components so that any one is in an excessive amount in another organic solvent to form a second polymer, and then mixing the first and second polymers and completing the polymerization, wherein when the diamine-based monomer components are in excess at the time of forming the first polymer, the dianhydride-based monomer components are in an excessive amount in the second polymer, and when the dianhydride-based monomer components are in excess in the first polymer, the diamine-based monomer components are in an excessive amount in the second polymer, thereby mixing the first and second polymers to polymerize the entire diamine-based monomer component and the entire dianhydride-based monomer component used in these reactions so that they are substantially equimolar to each other.

The above method is an example to aid in the implementation of the present invention, and the scope of the present invention is not limited thereto, and it goes without saying that any known method can be used.

Packaging Method Using Polyamic Acid

In one example, the present invention also provides a method for packaging inorganic electronic components, for example, a silicon wafer using the above-described polyamic acid composition.

Specifically, the packaging method comprises steps of:
applying the polyamic acid composition according to the present invention on an inorganic electronic component; and
heat-treating the applied polyamic acid composition at 20° C. to 400° C., and has
constitutions that in the polyamic acid composition, the antic acid groups of the polyamic acid are closed and dehydrated through a heat treatment process to generate polyimide, and
when the heat treatment is completed, the polyimide resin is cured and bonded on the inorganic electronic component.

The packaging method according to the present invention may be performed by applying the above-described polyamic acid composition on an inorganic electronic component, and heat-treating the applied composition to cure it into a polyimide thin film.

At this time, the average thickness of the cured polyimide thin film may be 0.5 μm to 15 μm, and specifically, may be 2 μm to 14 μm, or 2 to 5 μm. In addition, the polyamic acid composition may be applied on the inorganic electronic component such that the average thickness of the polyimide thin film satisfies the above range. Specifically, the average thickness of the polyamic acid composition applied on the inorganic electronic component may be 1 μm to 30 μm, and specifically, may be 2 μm, to 15 μm, or 2 μm to 5 μm.

In addition, the step of heat-treating the polyamic acid composition is a step of reacting the dianhydride-based monomer and the diamine-based monomer present in the applied polyamic acid composition to induce formation of polyimide chains, while heating the composition at a variable or constant heating rate, which may comprise a first heat treatment step of performing the heat treatment at 20° C. to 200° C.; and a second heat treatment step of performing the heat treatment at 200° C. to 400° C., wherein the first and second heat treatment steps may be performed continuously or discontinuously.

At this time, in the first heat treatment step, the temperature may be raised to an appropriate temperature and then allowed to stand for a predetermined time while maintaining the elevated temperature, where the predetermined time may be, for example, 25 minutes to 45 minutes, and in detail, may be 25 minutes to 35 minutes.

In addition, the second heat treatment step is a step of reacting substantially both dianhydride-based monomer and diamine-based monomer unreacted in the first heat treatment step at a temperature of 200° C. to 400° C. to induce further formation of polymer chains, where the heat treatment temperature may be 250° C. to 400° C., 300° C. to 400° C., or 320° C. to 380° C., and it may be performed while raising the temperature at a variable or constant heating rate from the treatment temperature of the first heat treatment step to the temperature range.

By performing the heat treatment in the temperature range as above and leaving it for a predetermined time, the present invention may form a polyimide resin having an appropriate level of molecular weight, for example, a weight average molecular weight of 50,000 g/mole or less, specifically, 50,000 g/mole to 100,000 g/mole from the dianhydride-based monomer and the diamine-based monomer in the polyamic acid composition. The polyimide resin having such a weight average molecular weight may indwell a suitable level of coefficient of thermal expansion and glass transition temperature, elongation and tensile strength, and the like, may exhibit excellent adhesion, and may be removed more easily by $O_2$ plasma.

Meanwhile, if the heat treatment is completed, the packaging method using the polyamic acid composition according to the present invention may further comprise a step of cooling the formed polyimide resin to room temperature (22±3° C.).

In addition, the present invention may further comprise a step of removing the polyimide resin from the inorganic electronic component by treating the polyimide resin cooled to room temperature with $O_2$ plasma, where the inorganic electronic component from which the polyimide resin has been removed has a remarkably low concentration of the organic materials derived from the polyimide resin remaining on the surface, which may be 1,000 ppm or less, specifically, 10 ppm to 900 ppm or 10 ppm to 800 ppm.

Hereinafter, the present invention will be described in more detail by examples and experimental examples.

However, the following examples and experimental examples are merely illustrative of the present invention, and the contents of the present invention are not limited to the following examples and experimental examples.

EXAMPLES 1 TO 6

To a 40° C. reactor filled with N-methylpyrrolidone (NMP), a dianhydride main component; a dianhydride subcomponent; a diamine main component; and a diamine subcomponent were added at a molar ratio shown in Table 1 below and stirred for about 30 minutes to polymerize a polyamic acid. Isoquinoline was introduced thereto in an amount of 0.05 to 0.1 mole per 1 mole of the amic acid group, and then the aging process was performed at 80° C. for about 2 hours to prepare a polyamic acid composition. At this time, the viscosity of the polyamic acid composition was shown in Table 1.

TABLE 1

| | Dianhydride-based monomer | | | | Diamine-based monomer | | | | Viscosity [cP] |
|---|---|---|---|---|---|---|---|---|---|
| | Main component | | Subcomponent | | Main component | | Subcomponent | | |
| Example 1 | BTDA | 100 mol % | — | 0 mol % | PPD | 100 mol % | — | 0 mol % | 3,200 |
| Example 2 | BTDA | 85 mol % | PMDA | 15 mol % | PPD | 100 mol % | — | 0 mol % | 3,100 |
| Example 3 | BTDA | 70 mol % | PMDA | 30 mol % | PPD | 100 mol % | — | 0 mol % | 3,100 |
| Example 4 | BTDA | 100 mol % | — | 0 mol % | PPD | 50 mol % | ODA | 50 mol % | 3,100 |
| Example 5 | BTDA | 100 mol % | — | 0 mol % | PPD | 50 mol % | BAPP | 50 mol % | 3,200 |
| Example 6 | BTDA | 100 mol % | — | 0 mol % | PPD | 50 mol % | MDA | 50 mol % | 3,100 |

BTDA: 3,3',4,4'-benzophenonetetracarboxylic dianhydride
BPDA: 3,3',4,4'-biphenyltetacarboxylic dianhydride
PMDA: pyromellitic dianhydride
PPD: 1,4-diaminobenzene (p-phenylenediamine)
ODA: 4,4'-diaminodiphenyl ether (oxydianiline)
BAPP: 2,2-bis[4-(4-aminophenoxy)phenyl]propane
MDA: 4,4'-diaminodiphenylmethane (4,4'-methylenediamine)

COMPARATIVE EXAMPLES 1 TO 5

To a 40° C. reactor filled with N-methylpyrrolidone (NMP), a dianhydride main component; a dianhydride subcomponent; a diamine main component; and a diamine subcomponent were added at a molar ratio shown in Table 2 below and stirred for about 30 minutes to polymerize a polyamic acid. Isoquinoline was introduced thereto in an amount of 0.05 to 0.1 moles per 1 mole of the amic acid group, and then the aging process was performed at 80° C. for about 2 hours to prepare a polyamic acid composition. At this time, the viscosity of the polyamic acid composition was shown in Table 2.

The following experiments were performed on each of the obtained polyimide thin films, and the measured results were shown in Table 3 below:

A) Evaluation of Coefficient of Thermal Expansion (CTE)

TA's thermomechanical analyzer Q400 model was used, and the polyimide film was cut into 2 mm in width and 10 mm in length, and then the slope of the section from 100° C. to 350° C. was measured, while applying a tension of 0.05 N under a nitrogen atmosphere, raising the temperature from room temperature to 500° C., at a rate of 10° C./min and then cooling again at a rate of 10° C./min. The CTE was measured in the temperature rising section from 100° C. to 350° C.

TABLE 2

| | Dianhydride-based monomer | | | | Diamine-based monomer | | | | Viscosity [cP] |
|---|---|---|---|---|---|---|---|---|---|
| | Main component | | Subcomponent | | Main component | | Subcomponent | | |
| Comparative Example 1 | BTDA | 50 mol % | PMDA | 50 mol % | PPD | 100 mol % | — | 0 mol % | 3,200 |
| Comparative Example 2 | BPDA | 100 mol % | — | 0 mol % | PPD | 100 mol % | — | 0 mol % | 3,150 |
| Comparative Example 3 | — | 0 mol % | PMDA | 100 mol % | PPD | 100 mol % | — | 0 mol % | 3,300 |
| Comparative Example 4 | BTDA | 70 mol % | BPDA | 30 mol % | PPD | 100 mol % | — | 0 mol % | 3,100 |
| Comparative Example 5 | BPDA | 50 mol % | PMDA | 50 mol % | PPD | 100 mol % | — | 0 mol % | 3,200 |

BTDA: 3,3',4,4'-benzophenonetetracarboxylic dianhydride
BPDA: 3,3',4,4'-biphenyltetacarboxylic dianhydride
PMDA: pyromellitic dianhydride
PPD: 1,4-diaminobenzene (p-phenylenediamine)
ODA: 4,4'-diaminodiphenyl ether (oxydianiline)
BAPP: 2,2-bis[4-(4-aminophenoxy)phenyl]propane
MDA: 4,4'-diaminodiphenylmethane (4,4'-methylenediamine)

EXPERIMENTAL EXAMPLE 1

In order to evaluate the physical properties of the polyimide thin film prepared using the polyamic acid composition according to the present invention, each of the polyamic acid compositions prepared in Examples 1 to 3 and Comparative Examples 1 to 5 was applied on the surface of a stainless-steel support, and then heat-treated at 350° C. to form a polyimide thin film (average thickness: 12 to 13 μm) in which the polyamic acid composition was cured. Then, the formed polyimide thin film was peeled off from the surface of the stainless-steel support to obtain the polyimide thin film.

B) Evaluation of Glass Transition Temperature (Tg)

In addition, the loss elastic modulus and storage elastic modulus of the polyimide thin film were measured using a dynamic mechanical analyzer (DMA), and the glass transition temperature was derived by calculating the tangent θ from the measured results.

C) Evaluation of Tensile Strength

The tensile strength was measured according to KS 6518.

D) Evaluation of Elongation

According to ASTM D1708, the polyimide thin film was fixed to a universal testing machine and stretched at a rate of 1.3 mm/min to measure the elongation of the thin film.

TABLE 3

|  |  | Coefficient of thermal expansion [ppm/° C.] | Glass transition temperature [° C.] | Tensile strength [MPa] | Elongation [%] |
|---|---|---|---|---|---|
| Example | 1 | 8.9 | 428 | 310 | 9.1 |
|  | 2 | 7.6 | 435 | 332 | 11.4 |
|  | 3 | 7.1 | 441 | 344 | 13.1 |
|  | 4 | 13.5 | 402 | 274 | 14.5 |
|  | 5 | 21.5 | 362 | 211 | 18.5 |
|  | 6 | 15.5 | 374 | 138 | 14.8 |
| Comparative | 1 | 6.7 | 446 | 383 | 8.1 |
| Example | 2 | 8.7 | 431 | 397 | 9.8 |
|  | 3 | Unmeasurable | Unmeasurable | Unmeasurable | Unmeasurable |
|  | 4 | 7.8 | 432 | 385 | 11.5 |
|  | 5 | Unmeasurable | Unmeasurable | Unmeasurable | Unmeasurable |

As shown in Table 3, Examples according to the present invention exhibited appropriate coefficients of thermal expansion that can be preferably applied to an inorganic substrate such as silicon. Moreover, in Examples, the glass transition temperature, tensile strength and elongation all met the appropriate levels intended in the present invention.

EXPERIMENTAL EXAMPLE 2

In order to evaluate the bonding and detachment performance of the polyimide thin film prepared using the polyamic acid composition according to the present invention, each of the polyamic acid compositions prepared in Examples 1 to 6 and Comparative Examples 1 to 5 was applied on a silicon-based wafer, and heat-treated at 350° C. to form a polyimide thin film (average thickness: 12 to 13 μm) that the polyamic acid composition was cured.

A) Evaluation of Adhesion to Inorganic Materials

According to the cross-cut tape method B of ASTM D3359, a 25 mm-wide transparent pressure-sensitive tape was bonded to the surface of the polyimide resin, and 6 horizontal lines *6 vertical lines were cut so that the spacing of each line was 2 mm. Thereafter, the transparent pressure-sensitive tape was pulled at 180° and removed, and it was visually checked whether or not the polyimide thin film was detached. At this time, the degree of detachment of the polyimide thin film was graded according to the following criteria:

5B: the detached area is 0% relative to the total area of the polyimide thin film,
4B: the detached area is less than 5% relative to the total area of the polyimide thin film,
3B: the detached area is 5% or more and less than 15% relative to the total area of the polyimide thin film,
2B: the detached area is 15% or more and less than 35% relative to the total area of the polyimide thin film,
1B: the detached area is 35% or more and less than 65% relative to the total area of the polyimide thin film, and
0B: the detached area is 65% or more relative to the total area of the polyimide thin film.

B) Evaluation of Residue Concentration after Detachment of Polyimide Thin Film

The silicon-based wafer on which the polyimide thin film was formed was cut into a width of 1 cm*a length of 1 cm, and the weight of the polyimide thin film formed on the wafer surface was measured. Then, the polyimide thin film was treated with $O_2$ plasma at 75 Watt and 150 mT for 1 minute and removed, and the organic residues were weighed after the $O_2$ plasma treatment to calculate the concentration of the organic residues.

The measured results were each shown in FIGS. 1 and 2 and Table 4 below.

TABLE 4

|  |  | Adhesion | Residue concentration [ppm] |
|---|---|---|---|
| Example | 1 | 4B | 280 |
|  | 2 | 3B | 485 |
|  | 3 | 3B | 720 |
|  | 4 | 3B | 780 |
|  | 5 | 3B | 650 |
|  | 6 | 3B | 880 |
| Comparative | 1 | 2B | 1,250 |
| Example | 2 | 1B | 2,580 |
|  | 3 | 3B | 3,840 |
|  | 4 | 3B | 4,100 |
|  | 5 | 2B | 1,380 |

As shown in FIGS. 1 and 2 and Table 4, it can be seen that the examples according to the present invention show excellent adhesion, it is easy to remove the polyimide thin film through $O_2$ plasma, and the concentration of organic residues is remarkably low after removing the thin film. Specifically, FIG. 1 is a photograph that the adhesion test on the polyimide thin film of Example 1 is performed and then the surface of the thin film is photographed, and referring to FIG. 1, the tape has been attached to the grid pattern and removed, and nevertheless, it can be confirmed that the removed part due to the bonding release is hardly identified.

On the other hand, FIG. 2 is a photograph that the adhesion test on the polyimide thin film of Comparative Example 1 is performed and then of the surface of the thin film is photographed, where it can be confirmed that a significant portion of the polyimide thin film has been detached.

In addition, referring to Table 4, in Comparative Examples 3 and 5, the polyamic acid composition were prepared from the combination of monomers having relatively rigid molecular structure, without using BTDA as a monomer having a benzophenone structure, and in Comparative Examples 3 and 5, a serious defect that the surface was broken occurred, and thus, evaluation of physical properties was impossible.

In the case of a low-viscosity polyamic acid composition near 3.000 cP, it tends to be rapidly cured during the heat treatment process, and at this time, the polyamic acid compositions of Comparative Examples 3 and 5 comprise rigid polymer chains derived from the rigid molecular structure monomers, whereby it is estimated that cracks have been caused in the process of rapidly curing.

Moreover, it can be understood that the use of BTDA as a monomer having a benzophenone structure may be advantageous in converting a low-viscosity polyamic acid composition near about 3,000 cP into a polyimide resin.

In addition, Comparative Example 1 is a case where a relatively small amount of BTDA, which is a main component, and a relatively excessive amount of PMDA are contained based on the content range of the present invention, and Comparative Example 2 is a case where BPDA is used instead of BTDA, where these Comparative Examples have showed poor adhesion and high residue concentrations as compared to Examples.

Moreover, it should be noted that Comparative Example 2 without using BTDA at all shows more negative results in the adhesion and residue concentration than Comparative Example 1 using a relatively small amount of BTDA.

This suggests that the benzophenone structure in BTDA can improve the adhesion of the polyimide resin and is directly related to minimizing the generation of organic residues by $O_2$ plasma. However, from the results of Comparative Example 1, it can be understood that when BTDA and PMDA are combined within the content ranee of the present invention, the improved adhesion and the concentration of organic residues by $O_2$ plasma can reach a desired level.

Furthermore, Comparative Example 4 is a case where a dianhydride-based monomer, in which BTDA and BPDA are combined, is used instead of the combination of BTDA and PMDA. Comparative Example 4 exhibited a remarkably higher concentration of organic residues as compared to Examples, where this suggests that the intended effect in the present invention is not always expressed, even when BTDA as a monomer having a benzophenone structure representing the dianhydride main component is used in a preferred content.

Therefore, in the case where the content of the dianhydride main component in the present invention is less than 100 mol %, it proves that when BTDA as a monomer having a benzophenone structure and PMDA having a rigid molecular structure due to one benzene ring are combined in an optimal ratio, the effect of the present invention can be preferably implemented.

The invention claimed is:

1. A polyamic acid composition comprising a polyamic acid prepared by polymerizing a dianhydride-based monomer and a diamine-based monomer,
    wherein the dianhydride-based monomer comprises the dianhydride main component having a benzophenone structure in an amount of 65 mol % or more and less than 100 mol %; and the dianhydride subcomponent having one benzene ring in an amount of more than 0 mol % and 35 mol % or less; and
    wherein the diamine-based monomer comprises a diamine component having one benzene ring in an amount of more than 50 mol % relative to the total number of moles.

2. The polyamic acid composition according to claim 1, wherein the dianhydride main component is 3,3',4,4'-benzophenonetetracarboxylic dianhydride (BTDA).

3. The polyamic acid composition according to claim 1, wherein the dianhydride subcomponent is pyromellitic dianhydride (PMDA).

4. The polyamic acid composition according to claim 1, wherein the diamine component having one benzene ring is one or more selected from 1,4-diaminobenzene (PPD), 1,3-diaminobenzene (MPD), 2,4-diaminotoluene, 2,6-diaminotoluene and 3,5-diaminobenzoic acid.

5. The polyamic acid composition according to claim 1, wherein the diamine component having one benzene ring is 1,4-diaminobenzene (PPD).

6. The polyamic acid composition according to claim 1, wherein the polyamic acid composition further comprises an additive containing at least one selected from acetic anhydride (AA), propionic acid anhydride, lactic acid anhydride, quinoline, isoquinoline, ß-picoline (BP) and pyridine.

7. The polyamic acid composition according to claim 6, wherein the additive is contained in an amount of 0.01 moles to 10 moles per 1 mole of the amic acid group in the polyamic acid.

8. The polyamic acid composition according to claim 1, wherein the polyamic acid composition has a viscosity of 2,000 cP to 5,000 cP at 23° C.

9. A polyimide resin,
    wherein the polyimide resin has
    a coefficient of thermal expansion of 9 ppm/° C. or less, and
    a glass transition temperature of 420° C. or more, and
    when measuring adhesion according to ASTM D3359, the area of the polyimide detached from an inorganic substrate is less than 16% of the total polyimide.

10. The polyimide resin, according to claim 9, wherein the polyimide resin has a tensile strength of 300 MPa or more and an elongation of 9% or more.

11. A packaging method, comprising steps of: applying the polyamic acid composition according to claim 1 on an inorganic electronic component; and
    heat-treating the applied polyamic acid composition at 20° C. to 400° C.,
    wherein in the polyamic acid composition, the amic acid groups of the polyamic acid are dehydrated to form rings through a heat treatment process to generate polyimide, and
    when the heat treatment is completed, the polyimide resin is cured and bonded on the inorganic electronic component.

12. The packaging method according to claim 11,
    wherein the step of heat-treating comprises:
    a first heat treatment step of performing the heat treatment at 20° C. to 200° C.; and
    a second heat treatment step of performing the heat treatment at 200° C. to 400° C.

13. The packaging method according to claim 12,
    further comprising a step of cooling the polyimide resin formed by completing the second heat treatment step to room temperature.

14. The packaging method according to claim 13,
    further comprising a step of treating the polyimide resin with $O_2$ plasma to remove the polyimide resin from the inorganic electronic component after the step of cooling the polyimide resin to room temperature,
    wherein the concentration of organic materials derived from the polyimide resin remaining in the inorganic electronic component is 1,000 ppm or less after the removing step is completed.

* * * * *